United States Patent
Chang et al.

(10) Patent No.: US 7,817,770 B2
(45) Date of Patent: Oct. 19, 2010

(54) SHIFT REGISTER WITH LOWER COUPLING EFFECT AND A RELATED LCD

(75) Inventors: Lee-Hsun Chang, Hsin-Chu (TW); Yu-Wen Lin, Hsin-Chu (TW); Jing-Ru Chen, Hsin-Chu (TW); Shu-Wen Cheng, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 867 days.

(21) Appl. No.: 11/686,949

(22) Filed: Mar. 15, 2007

(65) Prior Publication Data

US 2008/0048964 A1 Feb. 28, 2008

(30) Foreign Application Priority Data

Aug. 24, 2006 (TW) .............................. 95131125 A

(51) Int. Cl.
*G11C 19/00* (2006.01)
*G09G 3/36* (2006.01)
*G06F 3/038* (2006.01)

(52) U.S. Cl. ...................... 377/64; 345/100; 345/204; 377/69; 377/70

(58) Field of Classification Search ........... 345/97–100, 345/204–214, 690–697; 377/64, 69, 70, 377/73–77
See application file for complete search history.

(56) References Cited

U.S. PATENT DOCUMENTS

| | | | | |
|---|---|---|---|---|
| 6,922,217 | B2 | 7/2005 | Kim | |
| 7,317,780 | B2 * | 1/2008 | Lin et al. | ...................... 377/67 |
| 7,342,568 | B2 * | 3/2008 | Wei et al. | ..................... 345/100 |
| 2003/0231735 | A1 | 12/2003 | Moon | |
| 2005/0001914 | A1 | 1/2005 | Kueny | |
| 2006/0146978 | A1 * | 7/2006 | Jang | ............................. 377/64 |
| 2007/0127620 | A1 * | 6/2007 | Moon et al. | ................... 377/64 |

FOREIGN PATENT DOCUMENTS

| | | |
|---|---|---|
| CN | 1817027 A | 8/2006 |
| CN | 1825491 A | 8/2006 |
| TW | 200623006 | 7/2006 |

* cited by examiner

*Primary Examiner*—Bipin Shalwala
*Assistant Examiner*—Sosina Abebe
(74) *Attorney, Agent, or Firm*—Winston Hsu; Scott Margo; Min-Lee Teng

(57) ABSTRACT

A shift register for use in an LCD is disclosed. The shift register provides better gate driving signals with the lower coupling effect. The shift register includes two switches. The control node of the first switch is electrically coupled to the control node of the second switch. One end of the first switch receives a clock signal, and the other end of the first switch is electrically coupled to one end of the second switch. The other end of the second switch outputs a gate driving signal. Both of the two switches are controlled by a control signal.

18 Claims, 10 Drawing Sheets

SHIFT REGISTER WITH LOWER COUPLING EFFECT AND A RELATED LCD

BACKGROUND OF THE INVENTION

1. Field of the Invention

The present invention relates to a shift register with a lower coupling effect. More particularly, the present invention relates to a LCD having shift registers with lower coupling effect.

2. Description of the Prior Art

FIG. 1 is a diagram illustrating a conventional LCD 100. The LCD 100 comprises a pixel circuit 110, a shift register area 120. The pixel circuit 110 comprises a plurality of pixels 111. The shift register area 120 comprises a plurality of shift registers S1-Sn for receiving the external voltage level signal VSS, the clock signal XCK, the clock signal CK, and a start signal ST and for transmitting gate driving signals G1-Gn to the pixel circuit 110 according to the received signals. The pixel circuit 110 respectively drives the pixels 111 according to the gate driving signals G1-Gn for displaying.

FIG. 2 is a diagram illustrating the shift register area 120 of the conventional LCD 100. As shown in FIG. 2, all of the shift registers S1-Sn receives the voltage level signal VSS, the clock signal XCK, and the clock signal CK. The first shift register S1 receives the start signal ST, and transmits the first gate driving signal G1 to the pixel circuit 110 and the second shift register S2 after a predetermined period according to the signals VSS, XCK, and CK. The second shift register S2 receives the first gate driving signal G1, and transmits the second gate driving signal G2 to the pixel circuit 110 and the third shift register S3 after the predetermined period, and so on. Thus, each shift register of the shift register area 120 sequentially transmit gate driving signals to drive the pixels 111 of the pixel circuit 110.

FIG. 3 is a diagram illustrating the signals of the conventional shift register area 120. As shown in FIG. 3, when the first shift register S1 receives the start signal ST, the shift register area 120 is triggered to sequentially generate the gate driving signal G1, and then G2, and so on. In this way, the pixels 111 of the pixel circuit 110 are sequentially driven for displaying.

FIG. 4 is a block diagram illustrating a conventional shift register 400. The shift register 400 comprises seven switches Q1-Q7, 3 control circuits 410-430, and an output circuit 440. The output circuit 440 comprises a switch Q8. The control circuit 410 respectively controls the voltages of the nodes B and C through the switches Q2 and Q3 according to the clock signal CK. When the control circuit 410 turns on the switches Q2 and Q3 according to the clock signal CK, the voltages of the nodes B and C are pulled to the voltage level VSS. The control circuit 420 respectively controls the voltages of the nodes B and C through the switches Q4 and Q5 according to the clock signal XCK. When the control circuit 420 turns on the switches Q4 and Q5 according to the clock signal XCK, the voltages of the nodes B and C are pulled to the voltage level VSS. The control circuit 430 respectively controls the voltages of the nodes B and C through the switches Q6 and Q7 according to the gate driving signal Gn+1 of the next stage. When the control circuit 430 turns on the switches Q6 and Q7 according to the gate driving signal Gn+1 of the next stage, the voltages of the nodes B and C are pulled to the voltage level VSS. The output circuit 440 transmits the clock signal CK to the node C for generating the gate driving signal Gn according to the voltages of the nodes B and C. In this way, when the gate driving signal Gn−1 of the previous stage inputs the shift register 400, the shift register 400 operates the way shown in FIG. 3, delays a predetermined period, and then outputs the gate driving signal Gn.

FIG. 5 is a diagram illustrating a gate driving signal Gn of the conventional shift register. Because an intrinsic capacitor C1 of the switch Q8 exists between the nodes B and A which enables the current to flow from the node A to the node B, this interferes with the switch Q8 and causes the switch Q8 to turn off incompletely and still pass unwanted signals. In other words, when the switch Q8 is turned-off, parts of the clock signal CK still pass to the node C and affects the gate driving signal Gn. The condition described above gets worse as the switch Q8 becomes old. Thus, the gate driving signal gets worse and the quality of the display is deteriorated.

SUMMARY OF THE INVENTION

The present invention provides a shift register with lower coupling effect. The shift register comprises a first node; a first switch comprising a first end electrically coupled to an output end of a shift register of the previous stage; a second end electrically coupled to the first node; and a control end electrically coupled to the output end of the shift register of the previous stage; an output end; a first control circuit comprising a first input end for receiving a first clock signal; a second input end for receiving a second clock signal; a third input end electrically coupled to the output end of the shift register of the previous stage; a first output end electrically coupled to the first node; and a second output end electrically coupled to the output end of the shift register; a second control circuit comprising a first input end for receiving the second clock signal a second input end electrically coupled to the output end of the shift register of the previous stage a first output end electrically coupled to the first end; and a second output end electrically coupled to the output end of the shift register; a third control circuit comprising an input end electrically coupled to an output end of a shift register of the next stage; a first output end electrically coupled to the first node; and a second output end electrically coupled to the output end of the shift register; a second switch comprising a first end for receiving the first clock signal; a second end; and a control end electrically coupled to the first node; and a third switch comprising a first node electrically coupled to the second end of the second switch; a second end electrically coupled to the output end of the shift register; and a control node electrically coupled to the first node.

The present invention further provides a liquid crystal display with lower coupling effect. The liquid crystal display comprises a first glass substrate comprising a plurality of cascade-connected shift registers, each shift register with lower coupling effect comprising a first node; a first switch comprising a first end electrically coupled to an output end of a shift register of the previous stage; a second end electrically coupled to the first node; and a control end electrically coupled to the output end of the shift register of the previous stage; an output end; a first control circuit comprising a first input end for receiving a first clock signal; a second input end for receiving a second clock signal; a third input end electrically coupled to the output end of the shift register of the previous stage; a first output end electrically coupled to the first node; and a second output end electrically coupled to the output end of the shift register; a second control circuit comprising a first input end for receiving the second clock signal; a second input end electrically coupled to the output end of the shift register of the previous stage; a first output end electrically coupled to the first end; and a second output end electrically coupled to the output end of the shift register; a third control circuit comprising an input end electrically coupled to an output end of a shift register of the next stage; a first output end electrically coupled to the first node; and a second output end electrically coupled to the output end of the shift register; a second switch comprising a first end for receiving the first clock signal; a second end; and a control end electrically coupled to the first node; and a third switch comprising a first node electrically coupled to the second end of the second switch; a second end electrically coupled to the output end of the shift register; and a control node electrically coupled to the first node; and a pixel circuit electrically coupled to at least an output end of one shift register of the plurality of the cascade-connected shift registers; a second glass substrate; and a liquid crystal layer formed between the first glass substrate and the second glass substrate.

These and other objectives of the present invention will no doubt become obvious to those of ordinary skill in the art after reading the following detailed description of the preferred embodiment that is illustrated in the various figures and drawings.

DETAILED DESCRIPTION

Figure 6:
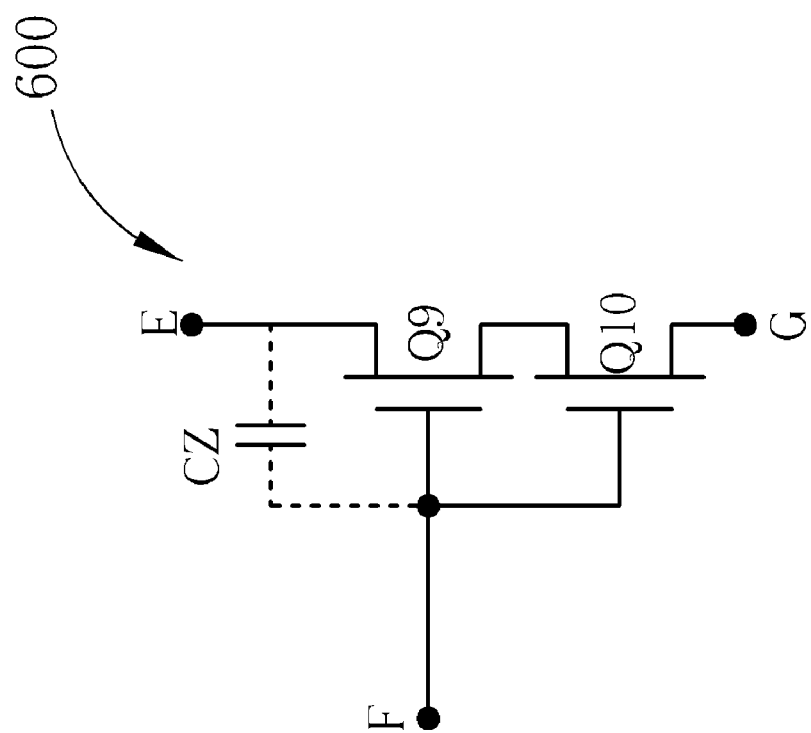
FIG. 6 is a diagram illustrating an output circuit of the present invention.

FIG. 6 is a diagram illustrating an output circuit 600 of the present invention. The output circuit 600 comprises two switches Q9 and Q10. The control ends of the switches Q9 and Q10 are electrically coupled to node F for receiving the control signal on the node F and accordingly transmitting the signals on node E. In fact, because an intrinsic capacitor C2 exists between the nodes E and F, the switch Q9 turns off incompletely so that signals still pass through the switch Q9. This condition becomes worse as the switch Q9 becomes old, which is the drawback of the conventional circuit. Thus, the present invention provides another switch Q10 electrically coupled to the output end of the switch Q9. When both of the switches Q9 and Q10 are turned-off, although the switch Q9 is still interfered with by the intrinsic capacitor C2, the signals on the node E do not pass to node G because the switch Q10 is not interfered with and turned-off completely. In this way, the coupling effect of the prior art is solved and the performance of the output is improved.

Figure 1:
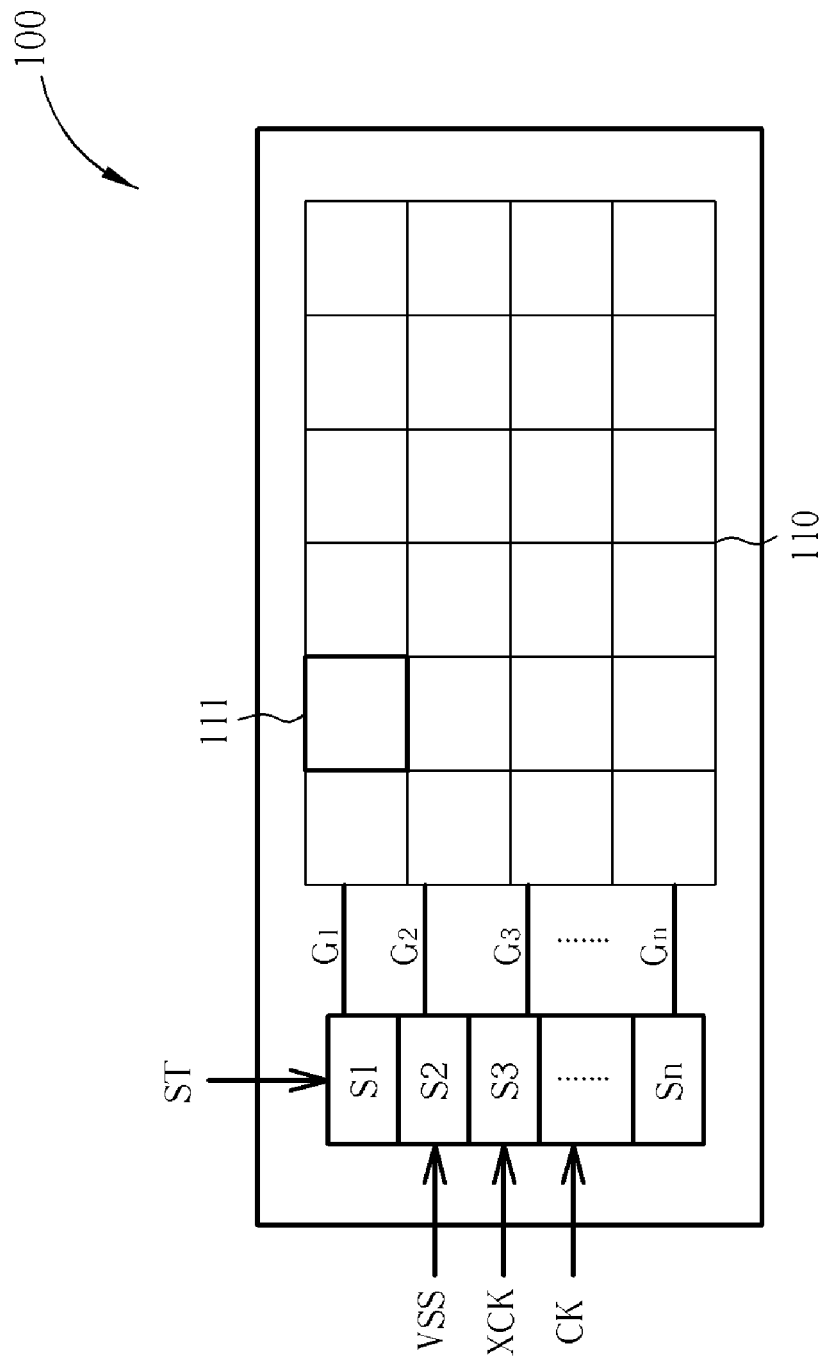
FIG. 1 is a diagram illustrating a conventional LCD.
Figure 2:
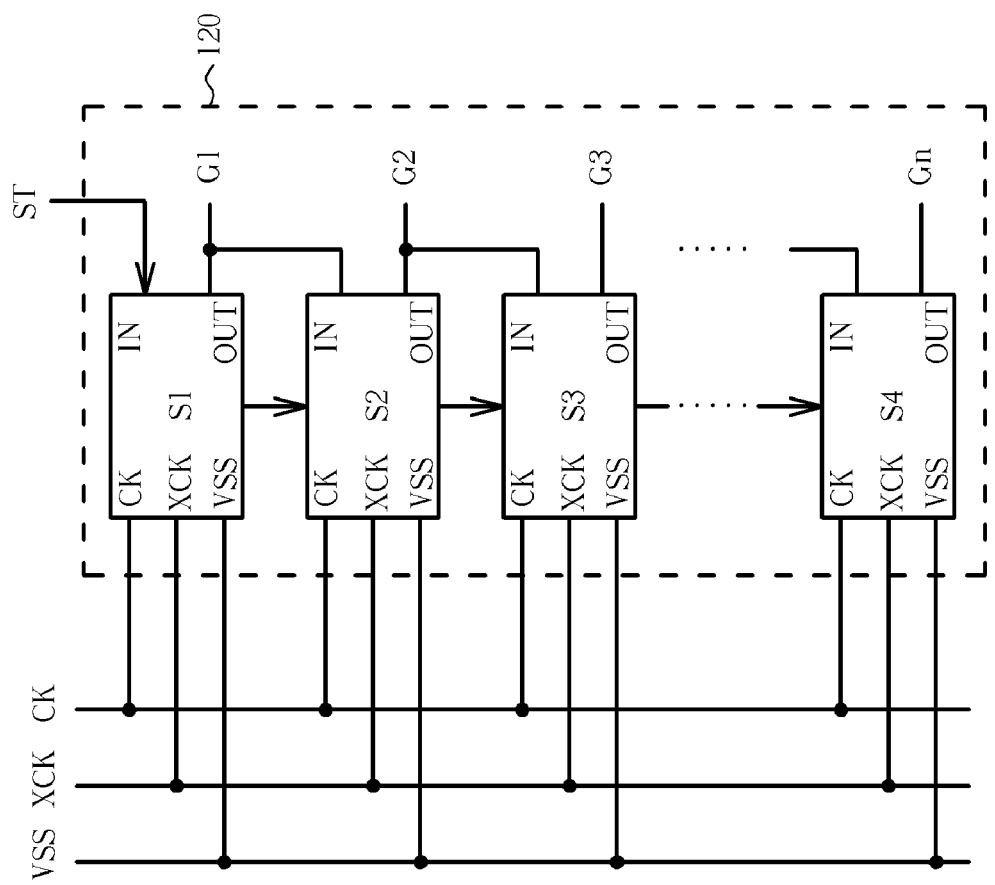
FIG. 2 is a diagram illustrating the shift register area of the conventional LCD.
Figure 3:
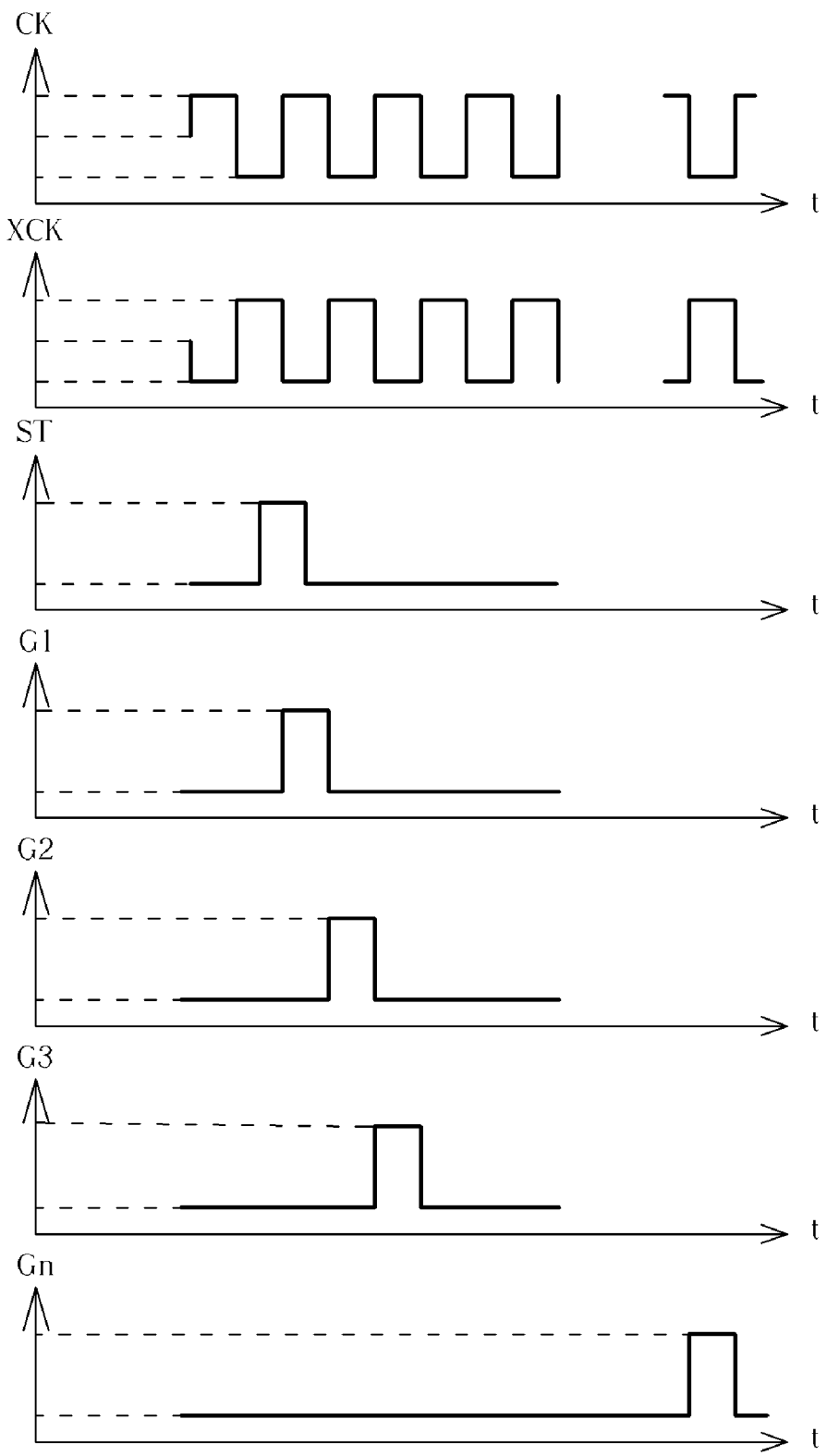
FIG. 3 is a diagram illustrating the signals of the conventional shift register area.
Figure 4:
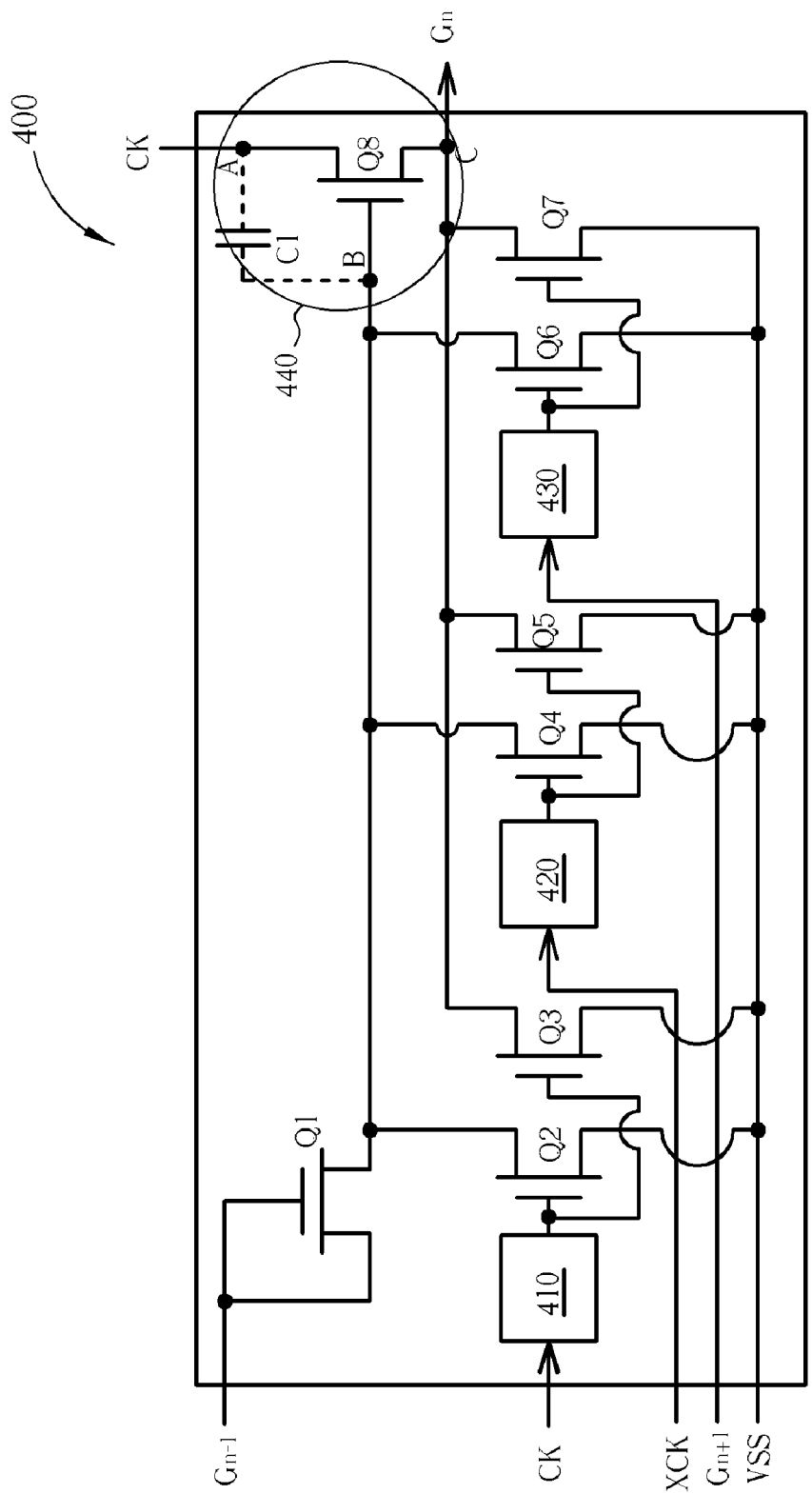
FIG. 4 is a block diagram illustrating a conventional shift register.
Figure 5:
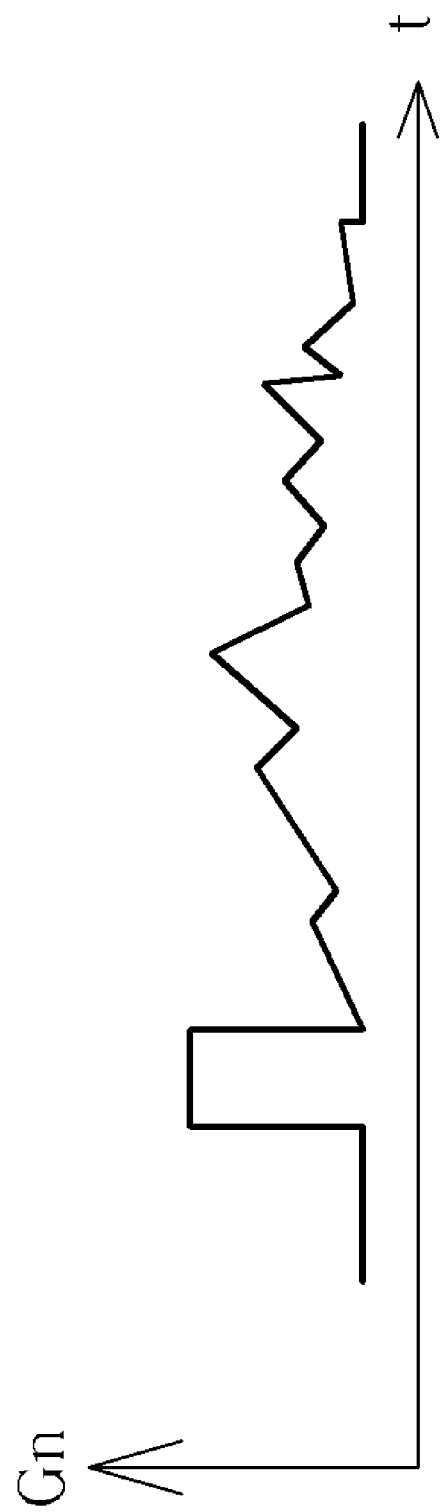
FIG. 5 is diagram illustrating a gate driving signal of the conventional shift register.
Figure 7:
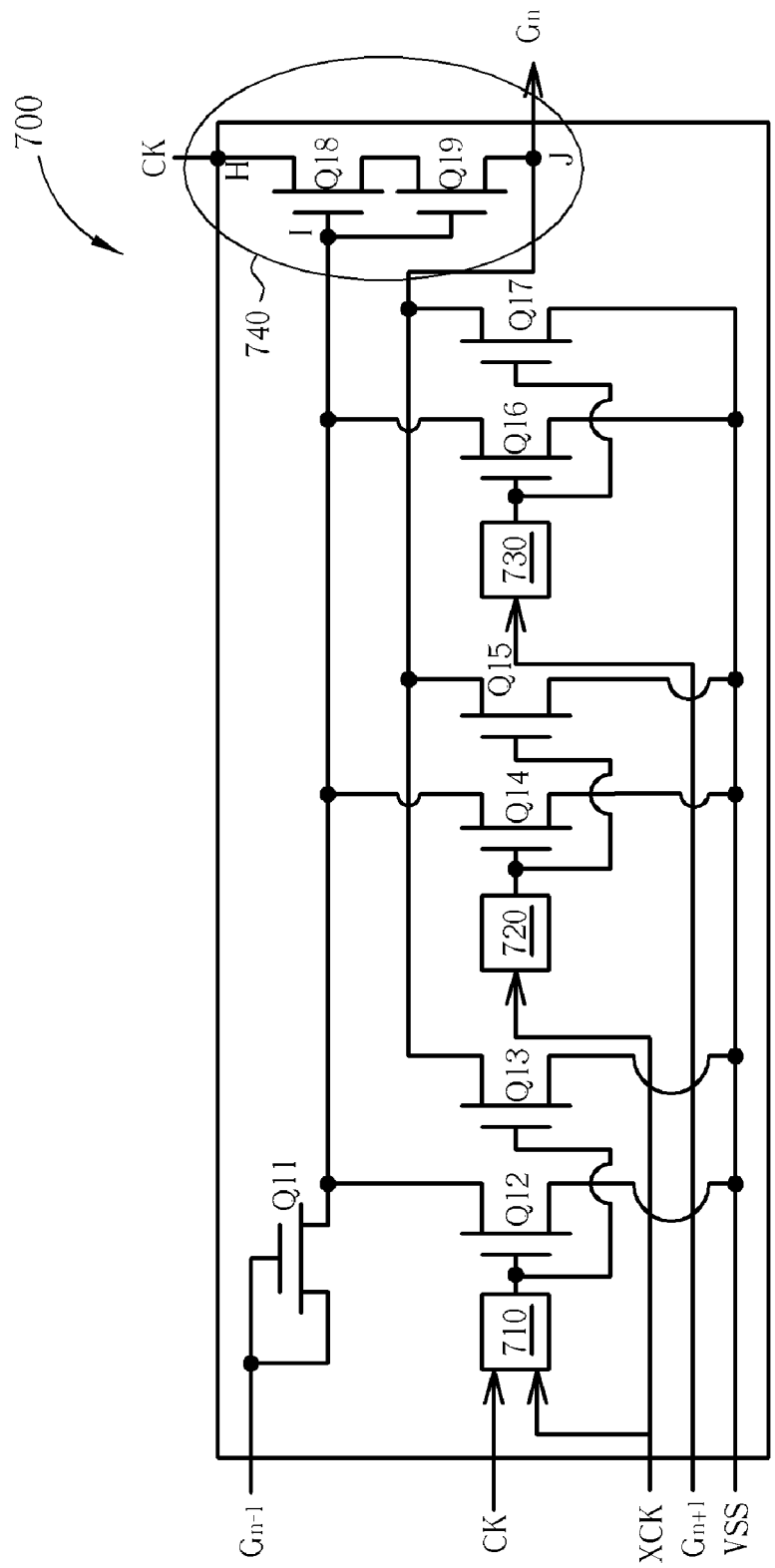
FIG. 7 is a block diagram illustrating the shift register of the present invention.

FIG. 7 is a block diagram illustrating the shift register 700 of the present invention. The shift register 700 comprises nine switches Q11 to Q19, three control circuits 710 to 730, and an output circuit 740. The output circuit 740 comprises two switches Q18 and Q19. The control circuit 710 respectively controls the voltages of the nodes I and J through the switches Q12 and Q13 according to the clock signal CK. When the control circuit 710 turns on the switches Q12 and Q13 according to the clock signal CK, the voltages of the nodes I and J are pulled to the voltage level VSS. The control circuit 720 respectively controls the voltages of the nodes I and J through the switches Q14 and Q15 according to the clock signal XCK. When the control circuit 720 turns on the switches Q14 and Q15 according to the clock signal XCK, the voltages of the nodes I and J are pulled to the voltage level VSS. The control circuit 730 respectively controls the voltages of the nodes I and J through the switches Q16 and Q17 according to the gate driving signal Gn+1 of the next stage. When the control circuit 730 turns on the switches Q16 and Q17 according to the gate driving signal Gn+1, the voltages of the nodes I and J are pulled to the voltage level VSS. The output circuit 730 transmits the clock signal CK to the node J for generating the gate driving signal Gn according to the voltages of the nodes I and J. In this way, as shown in FIG. 3, after the shift register 700 receives the gate driving signal Gn−1 of the previous stage for a predetermined period, the shift register 700 transmits the gate driving signal Gn.

Figure 8:
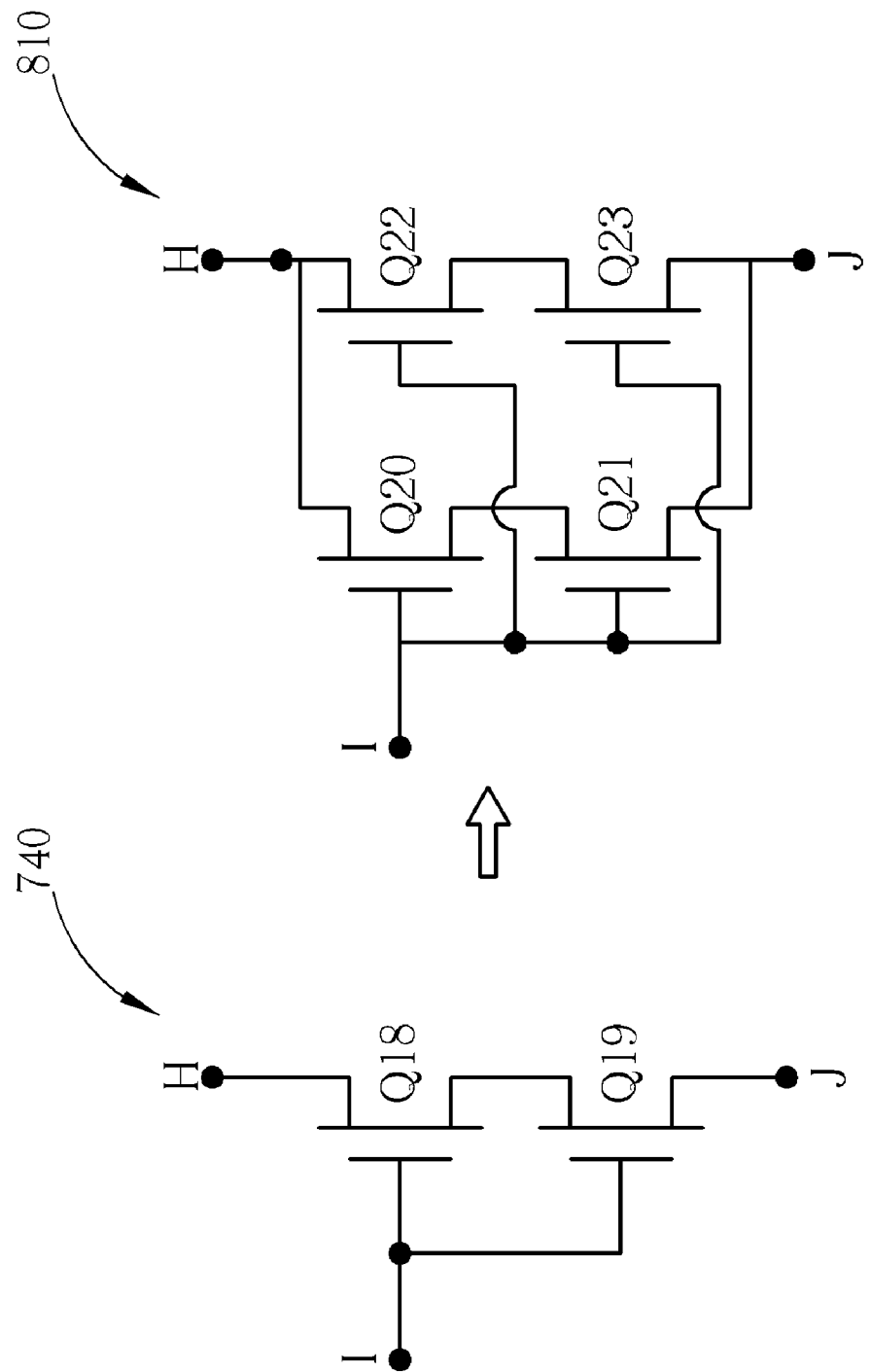
FIG. 8 is a diagram illustrating an output circuit according to another embodiment of the present invention.

FIG. 8 is a diagram illustrating an output circuit 810 according to another embodiment of the present invention. As shown in FIG. 8, in the shift register 700 of the present invention, the output circuit 740 is replaced by the output circuit 810. The output circuit 810 comprises four switches Q20 to Q23. The switches Q20 to Q23 are all electrically coupled to the node I for receiving the control signals on the node I and accordingly being turned on or off. One end of the switch Q20 is electrically coupled to the node H while the other end of the switch Q20 is electrically coupled to the switches Q21. One end of the switch Q22 is electrically coupled to the node H while the other end of the switch Q22 is electrically coupled to the switch Q23. The switches Q21 and Q23 are electrically coupled to the node J for transmitting signals to the node J.

Figure 9:
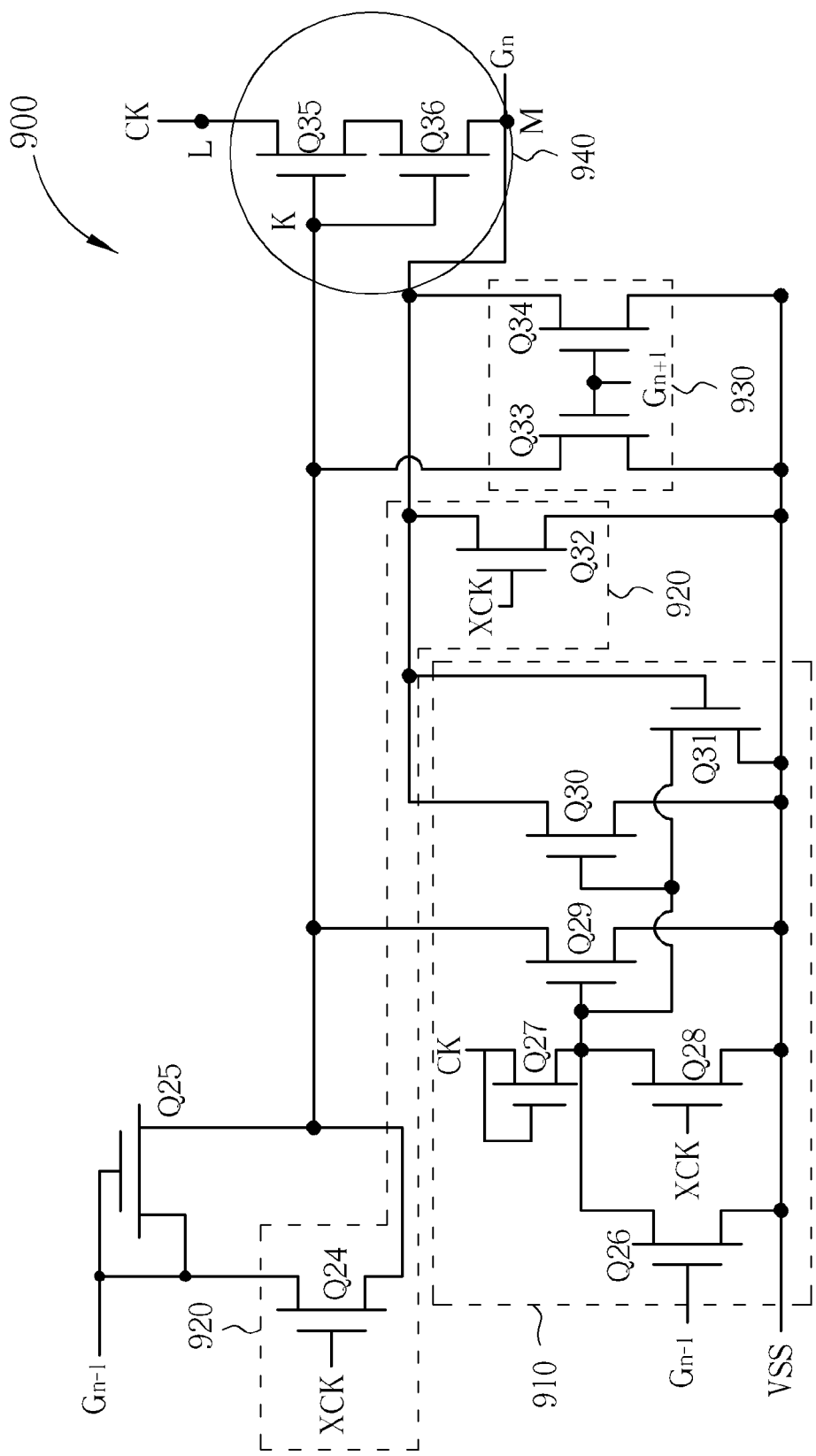
FIG. 9 is a circuit diagram illustrating the shift register of the present invention.

FIG. 9 is a circuit diagram illustrating the shift register 900 of the present invention. FIG. 9 is a detailed diagram of FIG. 7. The control circuits 910, 920, and 930 are respectively similar to the control circuits 710, 720, and 730. The output circuit 940 is similar to the output circuit 740. The functional description of the shift register 900 is the same as those described above, and is therefore omitted.

Figure 10:
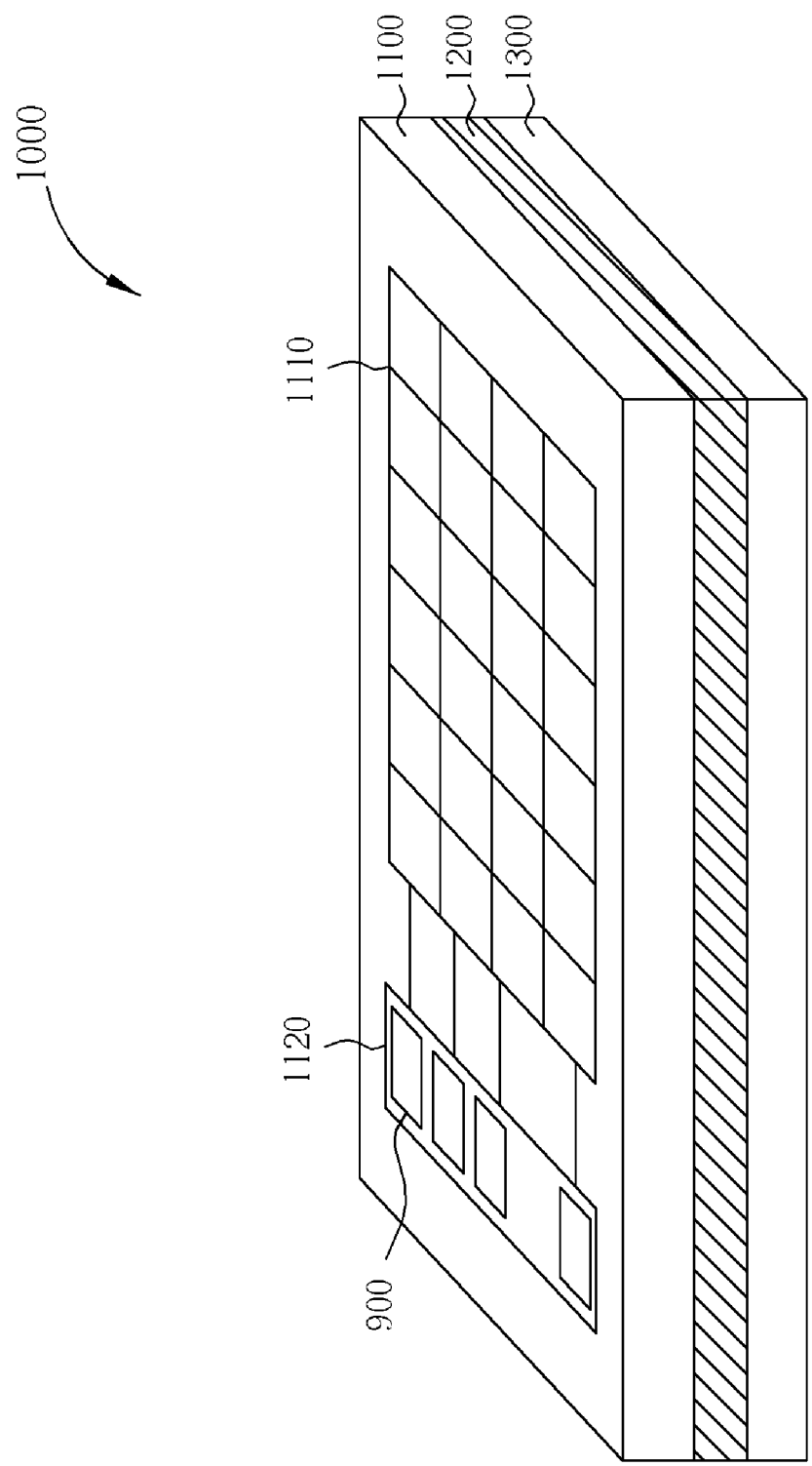
FIG. 10 is a diagram illustrating a LCD of the present invention.

FIG. 10 is a diagram illustrating a LCD 100 of the present invention. As shown in FIG. 10, the LCD 100 comprises a first glass substrate 1100, a liquid crystal layer 1200, and a second glass substrate 1300. The first glass substrate 1100 comprises a pixel circuit 1110 and a shift register area 1120. The shift register 1120 comprises a plurality of cascade-connected shift registers 900. The shift register area 1120 receives a start signal ST from an external device for sequentially transmitting gate driving signals to the pixel circuit 1110, and the pixel circuit 1110 is driven to display. Therefore, the display quality of the LCD 1000 is improved because the shift register 900 of the present invention reduces noises in the gate driving signals.

Additionally, the switches Q9 to Q23 can be realized with thin film transistors.

To sum up, the shift register of the present invention solves the coupling problem of the prior art, and the LCD with shift registers of the present invention has a better display quality.

Those skilled in the art will readily observe that numerous modifications and alterations of the device and method may be made while retaining the teachings of the invention.

What is claimed is:

1. A shift register with lower coupling effect comprising:
a first switch comprising:
a first end;
a second end; and
a control end electrically coupled to the first end of the first switch;
an output end;
a first control circuit comprising:
a first input end for receiving a first clock signal;
a second input end for receiving a second clock signal;
a third input end electrically coupled to the first end of the first switch;
a first output end electrically coupled to the second end of the first switch; and
a second output end electrically coupled to the output end of the shift register;
a second control circuit comprising:
a first input end for receiving the second clock signal;
a second input end electrically coupled to the first end of the first switch;
a first output end electrically coupled to the second end of the first switch; and
a second output end electrically coupled to the output end of the shift register;
a third control circuit comprising:
an input end;
a first output end electrically coupled to the second end of the first switch; and
a second output end electrically coupled to the output end of the shift register;
a second switch comprising:
a first end for receiving the first clock signal;
a second end; and
a control end electrically coupled to the second end of the first switch; and
a third switch comprising:
a first node electrically coupled to the second end of the second switch;
a second end electrically coupled to the output end of the shift register; and
a control node electrically coupled to the second end of the first switch.

2. The shift register of claim 1, wherein the first, the second, and the third switches are thin film transistors, and the control ends of the first, second, and third switches are the gates of the thin film transistors.

3. The shift register of claim 1, wherein the phase difference of the first clock signal and the second clock signal is 180 degrees.

4. The shift register of claim 1, wherein the first control circuit further comprises:
a first switch comprising:
a first end;
a second end; and
a control end electrically coupled to the third input end of the first control circuit;
a second switch comprising:
a first end electrically coupled to the first end of the first switch; and
a second end electrically coupled to the second input end of the first control circuit;
a third switch comprising:
a first end electrically coupled to the first input end of the first control circuit;
a second end electrically coupled to the first end of the first switch; and
a control end electrically coupled to the first input end of the first control circuit;
a fourth switch comprising:
a first end electrically coupled to the first output end of the first control circuit;
a second end electrically coupled to the second end of the first switch; and
a control end electrically coupled to the first end of the first switch;
a fifth switch comprising:
a first end electrically coupled to the second output end of the first control circuit;
a second end electrically coupled to the second end of the first switch; and
a control end electrically coupled to the first end of the first switch; and
a six switch comprising:
a first end electrically coupled to the first end of the first switch;
a second end electrically coupled to the second end of the first switch; and
a control end electrically coupled to the second output end of the first control circuit.

5. The shift register of claim 4, wherein the first, second, third, fourth, fifth, and sixth switches are thin film transistors, and the control ends of the first, second, third, fourth, fifth, and sixth switches are the gates of the thin film transistors.

6. The shift register of claim 1 wherein the second control circuit further comprises:
a first switch comprising:
a first end electrically coupled to the first output end of the second control circuit;
a second end electrically coupled to the second input end of the second control circuit; and
a control end electrically coupled to the first input end of the second control circuit; and
a second switch comprising:
a first end electrically coupled to the second output end of the second control circuit;
a second end; and
a control end electrically coupled to the first input end of the second control circuit.

7. The shift register of claim 6 wherein the first and the second switches are thin film transistors, and the control ends of the first and the second switches are the gates of the thin film transistors.

8. The shift register of claim 1 wherein the third control circuit further comprises:
a first switch comprising:
a first end electrically coupled to the first output end of the third control circuit;
a second end; and
a control end electrically coupled to the input end of the third control circuit; and
a second switch comprising:
a first end electrically coupled to the second output end of the third control circuit;
a second end electrically coupled to the second end of the first switch; and
a control end electrically coupled to the input end of the third control circuit.

9. The shift register of claim 8 wherein the first and the second switches are thin film transistors, and the control ends of the first and the second switches are the gates of the thin film transistors.

10. A liquid crystal display with lower coupling effect comprising:
- a first glass substrate comprising:
    - a plurality of cascade-connected shift registers, each shift register with lower coupling effect comprising:
        - a first switch comprising:
            - a first end;
            - a second end; and
            - a control end electrically coupled to the first end of the first switch;
        - an output end;
        - a first control circuit comprising:
            - a first input end for receiving a first clock signal;
            - a second input end for receiving a second clock signal;
            - a third input end electrically coupled to the first end of the first switch;
            - a first output end electrically coupled to the second end of the first switch; and
            - a second output end electrically coupled to the output end of the shift register;
        - a second control circuit comprising:
            - a first input end for receiving the second clock signal;
            - a second input end electrically coupled to the first end of the first switch;
            - a first output end electrically coupled to the second end of the first switch; and
            - a second output end electrically coupled to the output end of the shift register;
        - a third control circuit comprising:
            - an input end;
            - a first output end electrically coupled to the second end of the first switch; and
            - a second output end electrically coupled to the output end of the shift register;
        - a second switch comprising:
            - a first end for receiving the first clock signal;
            - a second end; and
            - a control end electrically coupled to the second end of the first switch; and
        - a third switch comprising:
            - a first node electrically coupled to the second end of the second switch;
            - a second end electrically coupled to the output end of the shift register; and
            - a control node electrically coupled to the second end of the first switch; and
    - a pixel circuit electrically coupled to at least an output end of one shift register of the plurality of the cascade-connected shift registers;
- a second glass substrate; and
- a liquid crystal layer formed between the first glass substrate and the second glass substrate.

11. The liquid crystal display of claim 10 wherein the first, the second, and the third switches are thin film transistors, and the control ends of the first, second, and third switches are the gates of the thin film transistors.

12. The liquid crystal display of claim 10 wherein the phase difference of the first clock signal and the second clock signal is 180 degrees.

13. The liquid crystal display of claim 10 wherein the first control circuit further comprises:
- a first switch comprising:
    - a first end;
    - a second end; and
    - a control end electrically coupled to the third input end of the first control circuit;
- a second switch comprising:
    - a first end electrically coupled to the first end of the first switch; and
    - a second end electrically coupled to the second input end of the first control circuit;
- a third switch comprising:
    - a first end electrically coupled to the first input end of the first control circuit;
    - a second end electrically coupled to the first end of the first switch; and
    - a control end electrically coupled to the first input end of the first control circuit;
- a fourth switch comprising:
    - a first end electrically coupled to the first output end of the first control circuit;
    - a second end electrically coupled to the second end of the first switch; and
    - a control end electrically coupled to the first end of the first switch;
- a fifth switch comprising:
    - a first end electrically coupled to the second output end of the first control circuit;
    - a second end electrically coupled to the second end of the first switch; and
    - a control end electrically coupled to the first end of the first switch; and
- a six switch comprising:
    - a first end electrically coupled to the first end of the first switch;
    - a second end electrically coupled to the second end of the first switch; and
    - a control end electrically coupled to the second output end of the first control circuit.

14. The liquid crystal display of claim 13, wherein the first, second, third, fourth, fifth, and sixth switches are thin film transistors, and the control ends of the first, second, third, fourth, fifth, and sixth switches are the gates of the thin film transistors.

15. The liquid crystal display of claim 10 wherein the second control circuit further comprises:
- a first switch comprising:
    - a first end electrically coupled to the first output end of the second control circuit;
    - a second end electrically coupled to the second input end of the second control circuit; and
    - a control end electrically coupled to the first input end of the second control circuit; and
- a second switch comprising:
    - a first end electrically coupled to the second output end of the second control circuit;
    - a second end; and
    - a control end electrically coupled to the first input end of the second control circuit.

16. The shift liquid crystal display of claim 15 wherein the first and the second switches are thin film transistors, and the control ends of the first and the second switches are the gates of the thin film transistors.

17. The liquid crystal display of claim 10 wherein the third control circuit further comprises:
- a first switch comprising:
    - a first end electrically coupled to the first output end of the third control circuit;
    - a second end; and
    - a control end electrically coupled to the input end of the third control circuit; and a second switch comprising:
    a first end electrically coupled to the second output end of the third control circuit;
    a second end electrically coupled to the second end of the first switch; and
    a control end electrically coupled to the input end of the third control circuit.

18. The shift register of claim 17 wherein the first and the second switches are thin film transistors, and the control ends of the first and the second switches are the gates of the thin film transistors.

* * * * *